(12) United States Patent
Saijo et al.

(10) Patent No.: US 6,689,482 B1
(45) Date of Patent: Feb. 10, 2004

(54) METHOD OF MANUFACTURING METAL FOIL/CERAMICS JOINING MATERIAL AND METAL FOIL LAMINATED CERAMIC SUBSTRATE

(75) Inventors: Kinji Saijo, Yamaguchi (JP); Shinji Ohsawa, Yamaguchi (JP); Kazuo Yoshida, Kudamatsu (JP)

(73) Assignee: Toyo Kohan Co., Ltd., Tokyo (JP)

(*) Notice: Subject to any disclaimer, the term of this patent is extended or adjusted under 35 U.S.C. 154(b) by 0 days.

(21) Appl. No.: 09/700,213

(22) PCT Filed: May 13, 1999

(86) PCT No.: PCT/JP99/02463

§ 371 (c)(1),
(2), (4) Date: Feb. 16, 2001

(87) PCT Pub. No.: WO99/58470

PCT Pub. Date: Nov. 18, 1999

(30) Foreign Application Priority Data

May 13, 1998 (JP) ............................................. 10-146689

(51) Int. Cl.⁷ .................. B32B 15/04; B23K 31/02
(52) U.S. Cl. ................ 428/469; 428/697; 428/698; 428/699; 428/702; 428/940; 228/115; 228/234.1; 228/235.1; 228/235.2; 228/205
(58) Field of Search .................. 428/469, 697, 428/698, 699, 702, 940; 228/115, 234.1, 235.1, 235.2, 205, 193–195, 235.3

(56) References Cited

U.S. PATENT DOCUMENTS

| 4,709,844 A | * | 12/1987 | Sekiguchi et al. |
| 5,534,103 A | * | 7/1996 | Yano et al. |

FOREIGN PATENT DOCUMENTS

| JP | 60-30593 | * | 2/1985 |
| JP | 61-97174 | * | 5/1986 |
| JP | 61-270269 | * | 11/1986 |
| JP | 4-467070 | * | 2/1992 |
| JP | 404046070 A | * | 2/1992 |
| JP | 6-302486 | * | 10/1994 |

* cited by examiner

Primary Examiner—Deborah Jones
Assistant Examiner—Jennifer McNeil
(74) Attorney, Agent, or Firm—Browdy and Neimark, P.L.L.C.

(57) ABSTRACT

A method of manufacturing a high-quality metal foil/ceramics joining material (19) and a metal foil laminated ceramic substrate (20) which can prevent a damage to a ceramic material and enhance the productivity of the metal foil/ceramics joining material and the metal foil etched, are pressure-joined to ensure an easy and positive subsequent pressure-joining and the ceramic material (13) can be prevented from being broken because the ceramics material (13) is heated while being placed on a holder (14) and is pressure-joined under a pressure of 1 kg/mm² or lower.

10 Claims, 1 Drawing Sheet

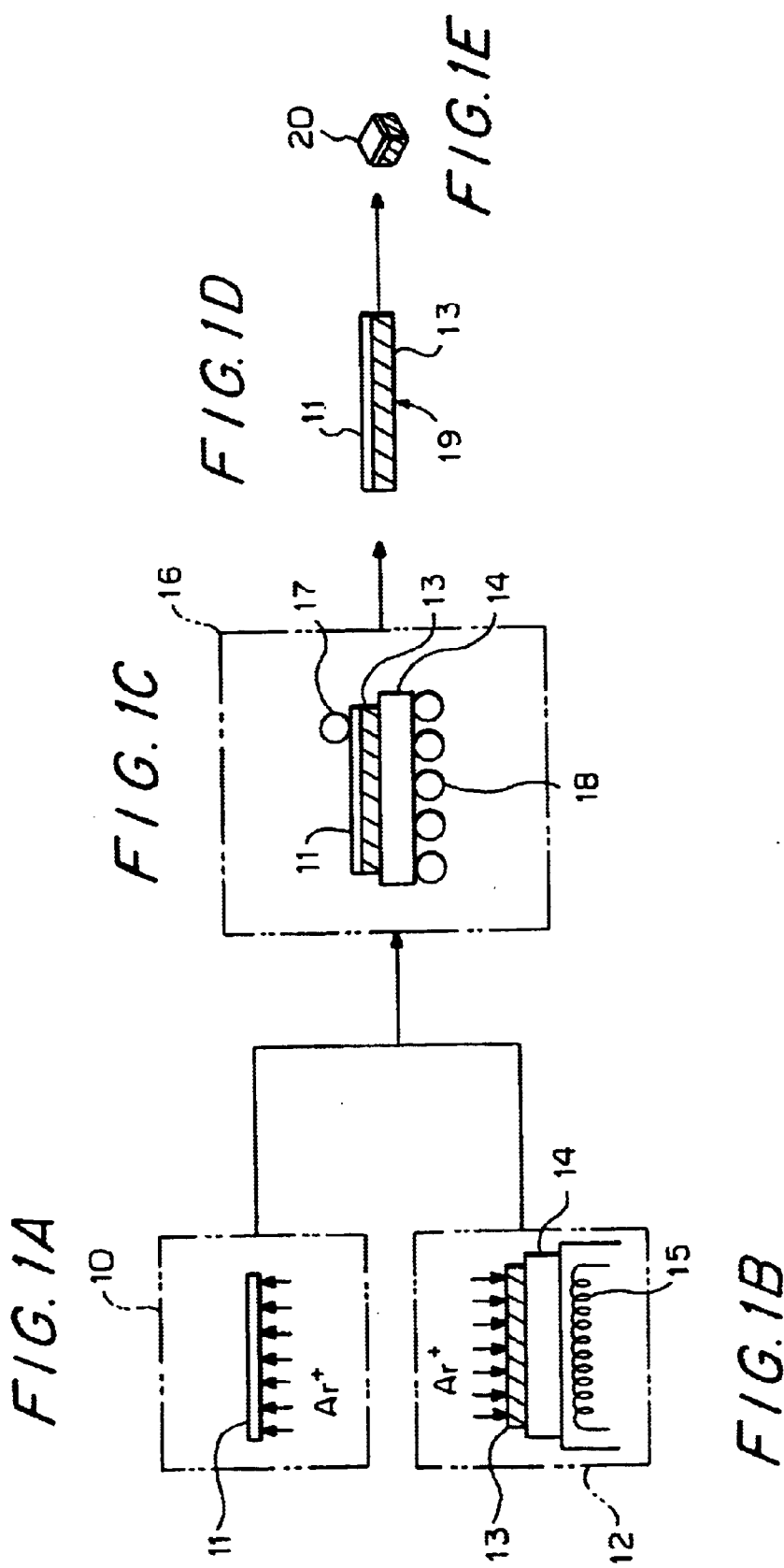

METHOD OF MANUFACTURING METAL FOIL/CERAMICS JOINING MATERIAL AND METAL FOIL LAMINATED CERAMIC SUBSTRATE

CROSS REFERENCE TO RELATED APPLICATION

The present application is the national stage under 35 U.S.C. 371 of PCT/JP99/02463, filed May 13, 1999.

FIELD OF THE INVENTION

The present, invention relates to a manufacturing method of a combination material of metal foil and ceramic by joining a metal foil onto surfaces of various types of ceramics, and also relates to a metal foil laminated ceramic substrate manufactured from said combination material of metal foil and ceramic.

PRIOR ART

Recently, a new improvement has been attempted by combining ceramics with metals in the application fields of ceramics. For example, a metal material composed of nickel alloy, titanium alloy, chromium alloy, or the like is joined to a ceramic material composed of alumina, zirconia, magnesia, or the like by using a combination technique such as diffusion combination so as to manufacture a combination material of metal and ceramic, which is used in various devices and apparatuses.

BACKGROUND OF THE INVENTION

However, since such conventional combination material of metal and ceramic is manufactured by simply joining a metal material to a ceramic material under a certain pressure, when the pressure is applied, there sometimes occurs fracture of the ceramic material which is a much more brittle material as compared with the metal material, thus causing problems in productivity.

An object of the present invention is to solve the problem mentioned above and provide a manufacturing method of a combination material of metal foil and ceramic capable of completely joining a metal foil to a ceramic material even with a low pressure applied thereto and preventing the ceramic material from fracturing so as to improve the productivity of a combination material of metal foil and ceramic or a metal foil laminated ceramic substrate, and also provide such metal foil laminated ceramic substrate.

DISCLOSURE OF THE INVENTION

In order to achieve the object mentioned above, the manufacturing method of a combination material of metal foil and ceramic comprises the steps of ion-etching a surface of a metal foil and a ceramic material to be joined together to activate and clean the surfaces, heating said surface of the ceramic material, which is held on a holder, to a temperature range of 250 to 500° C., pressure-welding said surface of the metal foil to said surface of the ceramic material held on the holder under a pressure not more than 1 kg/mm$^2$, and thus heat-joining the metal foil and the ceramic material to manufacture a combination material of metal foil and ceramic.

BRIEF DESCRIPTION OF THE DRAWING

FIG. 1 is an explanatory view showing the process of the manufacturing method for a combination material of metal foil and ceramic according to an embodiment of the present invention.

BEST MODE FOR CARRYING OUT THE INVENTION

As the metal foil, a monolayer foil composed of Al, Cu, Ni, Fe, or others, and a multilayer foil composed of Al—Cu, Al-invar-Cu or others can be used. The thickness of the metal foil is not specifically limited but may preferably be 10 to 500 μm, taking into consideration the manufacturing conditions for a metal foil laminated ceramic substrate and its use.

On the other hand, the ceramic material may include glass, $SiO_2$, $Al_2O_3$, SiC, $Si_3N_4$, AlN and so on. The thickness of the ceramic material can be suitably selected according to purposes and is not specifically limited. However, it may preferably be 100 μm to 1 mm, taking into consideration the manufacturing conditions for a metal foil laminated ceramic substrate and its use.

In the above mentioned method, the surface of the metal foil to be joined is ion-etched. This is because an oxide film formed on the surface of the metal foil can be surely removed by this manner to thereby clean and activate the surface at the same time. Also, the surface of the ceramic material is ion-etched. This is because the surface of the ceramic material can be activated by this manner.

The surface of the ceramic material is heated through the holder prior to the pressure-welding of the metal foil to the ceramic material. This is because the above mentioned activation of the surface can be promoted, thus facilitating the later process of pressure-welding. The heating temperature is ranging from 250 to 500° C. This is because there are differences in the suitable temperature range depending on the kinds of metal foils. For example, in the case of aluminum foil, the suitable heating range is 250 to 400° C. and in the case of silver foil, it is 350 to 500° C.

In the heating process, a holder is used. This is because, if heated with no support of the holder but directly by a heater or the like, the ceramic material is not uniformly heated and heat strains occur in the interior thereof, which sometimes causes the ceramic material to fracture.

The holder may preferably be made of a material which is hard and excellent in thermal conductivity, for example, cemented carbide composed of a WC-Co sintered material.

In the process of pressure-welding the metal foil to the ceramic material, the pressure applied thereto is not more than 1 kg/mm$^2$. This is because an application of a pressure exceeding 1 kg/mm$^2$ would cause the breakage of the ceramic material.

The pressure-welding of the metal foil to the ceramic material may preferably be conducted by passing the metal foil and the ceramic material held on the holder through between the pressure rolls which are rolling. This is because, by this manner, while maintained at not more than 1 kg/mm$^2$, the pressure can be efficiently applied onto the whole surfaces of the metal foil and the ceramic material to be joined to each other.

As the pressure roll, a heat-resistant roll, the surface of which is Teflon-coated, may preferably be used. This is because the pressure roll is required to have a heat resistance since the pressure roll is to be heated through the ceramic material in the pressurizing process.

The thus obtained combination material of metal foil and ceramic is cut into pieces of a desired size to thereby produce a metal foil laminated ceramic substrate.

The manufacturing method of a combination material of metal foil and ceramic according to the present invention is concretely explained below referring to an embodiment shown in the accompanying drawing, by way of an example.

First, as shown in FIG. 1(a), metal foil 11 composed of aluminum and having a thickness of 50 μm is disposed in ion-shower apparatus 10. The entire surface of one side of metal foil 11 which is to form a join surface is irradiated with an ion in an extremely low pressure inert gas (Ar+ gas, for example) atmosphere using an electric discharge between cathode and anode and an electronic irradiation, thus removing an oxide film from the surface so as to clean and activate the surface at the same time.

As shown in FIG. 1(b), ceramic material 13 composed of SiC and having a thickness of 300 μm is disposed in ion-shower apparatus 12 such that the ceramic material 13 is placed on plate-like holder 14 made of WC-Co alloy which is a cemented carbide. Ceramic material 13 is heated through holder 14 by electric heater 15, for an example as a heating apparatus, to a temperature range of 250 to 400° C. While this heating condition is maintained, the entire surface of one side of ceramic material 13 which is to form a join surface is irradiated with an ion in an extremely low pressure inert gas atmosphere using an electric discharge between cathode and anode and an electronic irradiation, thus activating the surface.

As shown in FIG. 1(c), metal foil 11 is taken out from ion-shower apparatus 10 and at the same time ceramic material 13 together with holder 14 is taken out from ion-shower apparatus 12. Metal foil 11 and ceramic material 13 placed on holder 14 are then transferred to pressurizing apparatus 16 and passed through between upper pressure roll 17 and lower pressure rolls 18, all of which are rolling, thus pressure-welding the metal foil to the ceramic material.

As shown in the drawing, a plurality of rolls are provided as lower pressure roll 18 and only one roll is provided as upper pressure roll 17. This is because, by the arrangement of the plurality of lower pressure rolls 18, metal foil 11 and ceramic material 13 placed on holder 14, which are reciprocatingly moved one time or several times, can be stably supported by them. This is also because, by the arrangement of one upper pressure roll 17, the surface of metal foil 11 reciprocatingly moved is sequentially pressurized by it and therefore the whole ceramic material 13 can be protected from being too much pressurized through metal foil 11, thus preventing ceramic material 13 from fracturing. In addition, since the pressure applied thereto is limited to not more than 1 kg/mm$^2$, it is possible to surely prevent the fracture of ceramic material 13.

Incidentally, upper and lower pressure rolls 17, 18 suffer the heat from holder 14 and ceramic material 13. Therefore, Teflon-coated heat resistant rolls may preferably be employed for pressure rolls 17, 18.

As shown in FIG. 1(d), combination material of metal foil and ceramic 19 thus produced by the above mentioned pressure-welding is taken out from pressurizing apparatus 16.

Combination material of metal foil and ceramic 19 is formed so as to be suitably used in various systems and devices.

As an example, as shown in FIG. 1(e), combination material of metal foil and ceramic 19 is cut into pieces of a desired size, thus manufacturing a good deal of metal foil laminated ceramic substrate 20 for IC use.

POSSIBILITY OF USE IN INDUSTRY

As described above, in the manufacturing method of a combination material of metal foil and ceramic, prior to pressure-welding a metal foil and a ceramic material, which are preliminarily ion-etched separately from each other, the ceramic material is heated. Accordingly, this heating facilitates and ensures the later process of pressure-welding. Further, since the ceramic material is heated while it is held on the holder, it is possible to prevent the ceramic material from fracturing. Furthermore, since the pressure to be applied at the time of pressure-welding is not more than 1 kg/mm$^2$, it is possible to prevent the ceramic material from fracturing. Accordingly, it is possible to manufacture a high quality combination material of metal foil and ceramic with a high productivity.

In the manufacturing method of a combination material of metal foil and ceramic, the pressure-welding of the metal foil to the ceramic material is carried out by passing the metal foil and the ceramic material placed on the holder through between the rolling pressure rolls. Accordingly, it is possible to protect the ceramic material from being too much pressurized. In this regard, it is possible to prevent the ceramic material from fracturing.

In the manufacturing method of a combination material of metal foil and ceramic, since a hard and good thermal-conductive material, for example, cemented carbide, is used for the holder, it is possible to heat the ceramic material uniformly and entirely all over the surface so as to effectively prevent the ceramic material from fracturing due to heat strains.

In the manufacturing method of a combination material of metal foil and ceramic, since Teflon-coated heat-resistant rolls are used for the pressure rolls, it is possible to keep the lifetime of the pressure rolls longer and reduce change times of the rolls, thus improving maintenance efficiency.

In the manufacturing method of a combination material of metal foil and ceramic, the combination material of metal foil and ceramic is cut into pieces of a desired size. Thus, it is possible to manufacture a good deal of metal foil laminated ceramic substrate usable for IC or others.

What is claimed is:

1. A manufacturing method of a metal foil laminated ceramic material comprising
    ion-etching a surface of a metal foil and a surface of a ceramic material to be joined to each other so as to activate and clean the surfaces, and to substantially free said surface of said metal foil of oxide,
    heating said surface of the ceramic material while the ceramic material is held on a holder, to a temperature range of 250 to 500° C.,
    pressure-welding said surface of the metal foil onto said surface of the ceramic material held on the holder under a pressure not more than 1 kg/mm$^2$, and thus heat-joining the metal foil and the ceramic material to manufacture a combination material of metal foil and ceramic.

2. A manufacturing method of a combination material of metal foil and ceramic according to claim 1, wherein said pressure-welding is conducted such that said metal foil and said ceramic material held on the holder are made to pass through between pressure rolls which are rolling.

3. A manufacturing method of a combination material of metal foil and ceramic according to claim 1, wherein said holder is made of a material which is hard and excellent in thermal conductivity.

4. A manufacturing method of a combination material of metal foil and ceramic according to claim 3, wherein said ceramic material is a cemented carbide.

5. A manufacturing method of a combination material of metal foil and ceramic according to claim 1, wherein heat-resistant rolls whose surfaces are coated with Teflon are used for said pressure rolls.

6. A metal foil directly laminated to a ceramic substrate, a surface of the ceramic substrate to which the metal foil is directly laminated having been uniformly heated to a temperature in the range of 250 to 500° C. during lamination of the metal foil to the ceramic substrate, the laminated surfaces of the metal foil and ceramic substrate having been activated and cleaned by ion-etching and then joined by pressure welding at a pressure not greater than 1 kg/mm$^2$, said surface of the metal foil being substantially free of oxide.

7. A metal foil laminated ceramic manufactured by
ion-etching a surface of a metal foil and a surface of a ceramic material to be joined to each other so as to activate and clean the surfaces, and provide the surface of metal foil to be substantially free of oxide,
heating said surface of the ceramic material while the ceramic material is held on a holder to a temperature range of 250 to 500° C.,
pressure-welding said surface of the metal foil onto said surface of the ceramic material held on the holder under a pressure not more than 1 and thus heat-joining the metal foil and the ceramic material to manufacture a combination material of metal foil and ceramic.

8. A metal foil laminated ceramic manufactured by,
ion-etchinq a surface of a metal foil and a surface of a ceramic material to be joined to each other so as to activate and clean the surfaces, and provide the surface of metal foil to be substantially free of oxide,
heating said surface of the ceramic material while the ceramic material is held on a holder, to a temperature range of 250 to 500° C.,
pressure-welding said surface of the metal foil onto said surface of the ceramic material held on the holder under a pressure not more than 1 kg/mm$^2$, and thus heat-joining the metal foil and the ceramic material to manufacture a combination material of metal foil and ceramic,
wherein said pressure-welding is conducted such that said metal foil and said ceramic material held on the holder are made to pass through between pressure rolls which are rolling.

9. A metal foil laminated ceramic manufactured by
ion-etching a surface of a metal foil and a surface of a ceramic material to be joined to each other so as to activate and clean the surfaces, and provide the surface of metal foil to be substantially free of oxide,
heating said surface of the ceramic material while the ceramic material is held on a holder, to a temperature range of 250 to 500° C.,
pressure-welding said surface of the metal foil onto said surface of the ceramic material held on the holder under a pressure not more than 1 kg/mm$^2$, and thus heat-joining the metal foil and the ceramic material to manufacture a combination material of metal foil and ceramic,
wherein said holder is made of a material which is hard and excellent in thermal conductivity.

10. A metal foil laminated ceramic manufactured by
ion-etching a surface of a metal foil and a surface of a ceramic material to be joined to each other so as to activate and clean the surfaces, and provide the surface of metal foil to be substantially free of oxide,
heating said surface of the ceramic material while the ceramic material is held on a holder, to a temperature range 250 to 500° C.,
pressure-welding said surface of the metal foil onto said surface of the ceramic material held on the holder under a pressure not more than 1 kg/mm$^2$, and thus heat-joining the metal foil and the ceramic material to manufacture a combination material of metal foil and ceramic,
wherein said holder is made of a material which is hard and excellent in thermal conductivity and wherein said ceramic material is a cemented carbide.

* * * * *